ary, Agent, or Firm — Yunling Ren

(12) United States Patent
Liu et al.

(10) Patent No.: US 9,706,690 B2
(45) Date of Patent: Jul. 11, 2017

(54) HEAT-DISSIPATING SYSTEM FOR HIGH-POWER CABINET AND STATIC VAR COMPENSATION SYSTEM

(71) Applicant: DELTA ELECTRONICS, INC., Taoyuan Hsien (TW)

(72) Inventors: Teng Liu, Taoyuan Hsien (TW); Zejun Wang, Taoyuan Hsien (TW); Aixing Tong, Taoyuan Hsien (TW); Meihua Jin, Taoyuan Hsien (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 323 days.

(21) Appl. No.: 13/843,967

(22) Filed: Mar. 15, 2013

(65) Prior Publication Data

US 2014/0063739 A1    Mar. 6, 2014

(30) Foreign Application Priority Data

Aug. 30, 2012    (CN) .......................... 2012 1 0315271

(51) Int. Cl.
  *H05K 7/20*   (2006.01)
(52) U.S. Cl.
  CPC ................................ *H05K 7/20909* (2013.01)
(58) Field of Classification Search
  CPC . G06F 1/20; H01L 23/467; H01L 2924/0002; H01L 23/4006; H01L 2924/00
  USPC ..................... 363/141; 361/600–678, 679.54
  See application file for complete search history.

(56) References Cited

U.S. PATENT DOCUMENTS

| | | | | |
|---|---|---|---|---|
| 4,728,160 A | * | 3/1988 | Mondor | H05K 7/1429 312/236 |
| 5,168,424 A | * | 12/1992 | Bolton | G06F 1/20 165/122 |
| 5,544,012 A | * | 8/1996 | Koike | H05K 7/20572 165/122 |
| 5,684,671 A | * | 11/1997 | Hobbs | G06F 1/183 312/223.2 |

(Continued)

FOREIGN PATENT DOCUMENTS

| | | |
|---|---|---|
| CN | 102447260 A | 5/2012 |
| TW | M293835 U | 7/2006 |
| TW | M421676 U | 1/2012 |

OTHER PUBLICATIONS

Office Action issued Sep. 7, 2015 by the CN Office.

*Primary Examiner* — Courtney Smith
*Assistant Examiner* — Matt Dhillon
(74) *Attorney, Agent, or Firm* — Yunling Ren

(57) ABSTRACT

A heat-dissipating system for high-power cabinet is provided, which comprises: a cabinet; at least one main air duct, which is formed in the cabinet with a first opening and a second opening, and a first heat-generating assembly, a second heat-generating assembly and at least one first fan, which are mounted in the at least one main air duct, wherein the first fan is mounted between the first heat-generating assembly and the second heat-generating assembly; and the outlet of the first fan faces the first heat-generating assembly, airflow enters the main air duct from the first opening of the main air duct, flows through the second heat-generating assembly, an inlet of the first fan, an outlet of the first fan, and the first heat-generating assembly in sequence, and finally is discharged out of the cabinet from the second opening of the main air duct cabinet.

15 Claims, 14 Drawing Sheets

(56) References Cited

U.S. PATENT DOCUMENTS

| | | | | |
|---|---|---|---|---|
| 6,262,906 B1* | 7/2001 | Salzmann | H05K 7/1432 | 363/141 |
| 6,477,965 B2* | 11/2002 | Yamaguchi | B60L 9/24 | 105/59 |
| 6,525,935 B2* | 2/2003 | Casebolt | G06F 1/181 | 312/236 |
| 6,728,099 B1* | 4/2004 | Tsang | H05K 7/20727 | 361/678 |
| 6,754,066 B2* | 6/2004 | Doan | H02B 1/32 | 361/600 |
| 7,042,110 B2* | 5/2006 | Mikhail | F03D 7/0224 | 290/40 C |
| 7,227,751 B2* | 6/2007 | Robbins | H05K 7/20736 | 312/223.1 |
| 7,319,596 B2* | 1/2008 | Fujiya | H05K 7/20736 | 165/122 |
| 7,365,976 B2* | 4/2008 | Fujiya | H05K 7/20736 | 361/679.48 |
| 7,408,773 B2* | 8/2008 | Wobig | G06F 1/20 | 165/104.33 |
| 7,551,437 B2* | 6/2009 | Itoh | G06F 1/20 | 165/80.2 |
| 7,864,523 B2* | 1/2011 | Iwakiri | H05K 7/20727 | 361/679.46 |
| 7,898,804 B2* | 3/2011 | Olesiewicz | H05K 7/20727 | 361/694 |
| 8,045,328 B1* | 10/2011 | Chen | H05K 7/20727 | 165/121 |
| 8,249,758 B2* | 8/2012 | Schugart | H02J 3/16 | 290/44 |
| 8,320,121 B2* | 11/2012 | Bisson | H05K 7/20563 | 361/679.5 |
| 8,325,479 B2* | 12/2012 | Siracki | H05K 7/20918 | 361/678 |
| 8,773,851 B2* | 7/2014 | Shigeno | H05K 7/20918 | 165/185 |
| 8,993,901 B2* | 3/2015 | Yoshida | H05K 7/20909 | 174/542 |
| 9,007,746 B2* | 4/2015 | Rajvanshi | H05K 7/20581 | 165/104.33 |
| 2002/0126449 A1 | 9/2002 | Casebolt | | |
| 2005/0012339 A1 | 1/2005 | Mikhail et al. | | |
| 2011/0255237 A1* | 10/2011 | Doll | G06F 1/20 | 361/679.46 |
| 2012/0014154 A1 | 1/2012 | Siracki et al. | | |
| 2012/0026686 A1* | 2/2012 | Suzuki | F24F 11/0001 | 361/689 |
| 2012/0029723 A1 | 2/2012 | Schugart et al. | | |
| 2014/0063739 A1* | 3/2014 | Liu | H05K 7/20909 | 361/697 |
| 2014/0160636 A1* | 6/2014 | Rajvanshi | H02B 1/565 | 361/608 |

\* cited by examiner

HEAT-DISSIPATING SYSTEM FOR HIGH-POWER CABINET AND STATIC VAR COMPENSATION SYSTEM

CROSS-REFERENCE TO RELATED APPLICATIONS

This application claims benefits of Chinese Patent Application No. 201210315271.7, filed on Aug. 30, 2012 in the State Intellectual Property Office of China, the disclosure of which is incorporated herein by reference in its entirety.

TECHNICAL FIELD

The present dis—closure relates to a heat-dissipating system for high-power cabinet and a static var compensation system.

BACKGROUND

The assemblies, such as high-power IGBT, reactor, and other heat-generating assembly in a heat-dissipating system for cabinet, dissipate large amount of heat during operation. It is likely to cause assemblies damaged due to high temperature if large amount of heat can not be dissipated timely. Thereby, the arrangement of the heat-dissipating assemblies and the rational design of the air duct become very important.

As shown in FIG. 1, the conventional heat-dissipating system for high-power cabinet comprises: a cabinet 1-6, a first air duct 1-9 formed in the cabinet 1-6, a first fan 1-8 and a first heat-generating assembly 1-10 mounted in the first air duct 1-9. The first air duct 1-9 has a first air inlet 1-11 located on the side surface of the cabinet 1-6 and a first air outlet 1-7 located on the top surface of the cabinet 1-6. The first fan 1-8 is positioned on the top portion of the cabinet 1-6, with the air outlet of the first fan 1-8 facing away from the first heat-generating assembly 1-10.

Thus, during the process that the first fan 1-8 cools the first heat-generating assembly 1-10, the air flows through the first heat-generating assembly 1-10 firstly, and then flows through the first fan 1-8, i.e., the first fan 1-8 cools the first heat-generating assembly 1-10 in manner of sucking air. Airflow temperature rises after the air flows through the first heat-generating assembly 1-10, and the airflow with higher temperature flows through the first fan 1-8, which will have a negative effect on the service life of the first fan 1-8. Moreover, the conventional heat-dissipating system is highly noisy, because the first fan 1-8 is installed on the top portion of cabinet 1-6.

In the case that the heat-dissipating system further comprises other minor heat-generating assemblies, it is necessary to provide extra air ducts for minor heat-generating assemblies for heat dissipation, since these minor heat-generating assemblies generally do not share the same air duct with the first heat-generating assembly 1-10. Thereby, a second air duct 1-4 is mounted in the cabinet 1-6. The second air duct 1-4 has a second air inlet 1-12 located on the lower side surface of the cabinet 1-6 and a second air outlet 1-1 located on the top of the cabinet 1-6. Other minor heat-generating assemblies, such as a second heat-generating assembly 1-5, a third heat-generating assembly 1-3, are mounted in the second air duct 1-4. A second fan 1-2 mounted in the second air duct 1-4 is used for cooling the second heat-generating assembly 1-5 and the third heat-generating assembly 1-3.

As shown in FIG. 1, the second heat-generating assembly 1-5 and the third heat-generating assembly 1-3 are positioned under the second fan 1-2, and face away from the outlet of the second fan 1-2. Similarly, the service life of the second fan 1-2 will be affected negatively, due to the higher temperature airflow sucked into the second fan 1-2. Additionally, the conventional heat-dissipating system is highly noisy, because the second fan 1-2 is installed on the top portion of cabinet 1-6.

SUMMARY

Embodiments of the present disclosure provide a heat-dissipating system for high-power cabinet and a static var compensation system, which are low noisy and beneficial to improving the service life of fan.

According to an aspect of the disclosure, A heat-dissipating system for high-power cabinet, comprising: a cabinet; at least one main air duct, which is formed in the cabinet with a first opening and a second opening, and a first heat-generating assembly, a second heat-generating assembly and at least one first fan, which are mounted in the at least one main air duct, wherein the first fan is mounted between the first heat-generating assembly and the second heat-generating assembly; and the outlet of the first fan faces the first heat-generating assembly, airflow enters the main air duct from the first opening of the main air duct, flows through the second heat-generating assembly, an inlet of the first fan, an outlet of the first fan, and the first heat-generating assembly in sequence, and finally is discharged out of the cabinet from the second opening of the main air duct cabinet.

According to another aspect of the disclosure, a static var compensation system, comprising: at least one heat-dissipating system for high-power cabinet in accordance with claim 1, the first heat-generating assembly and the second heat-generating assembly are both electronic assemblies used in the static var compensation system.

BRIEF DESCRIPTION OF THE DRAWINGS

The present disclosure will become more fully understood from the detailed description given hereinafter and the accompanying drawings which are given by way of illustration only, and thus are not limitative of the present disclosure

DETAILED DESCRIPTION

Figure 1:
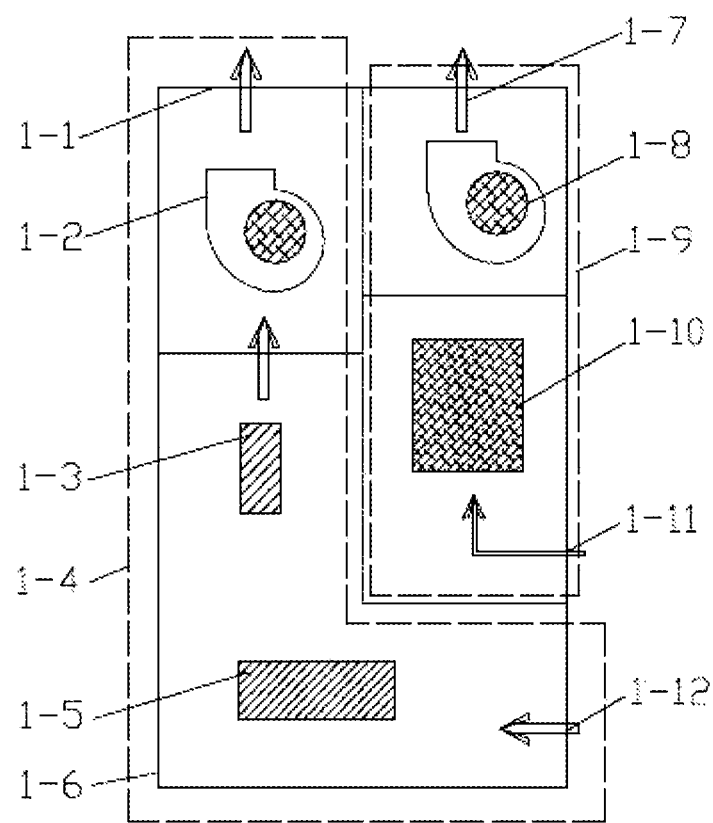
FIG. 1 is a schematic view of a conventional heat-dissipating system for high-power cabinet.

Exemplary embodiments of the present disclosure are described more fully hereinafter with reference to the accompanying drawings. The present disclosure may, however, be embodied in many different forms and should not be construed as limited to the embodiments set forth herein. Rather, these embodiments are provided so that this disclosure will be thorough and complete, and will fully convey the scope of the disclosure to those skilled in the art. In the drawings, the size and relative sizes of layers and regions may be exaggerated for clarity.

In the present disclosure, the top portion of the cabinet is defined as an area from the upper surface of the cabinet down to approximately 25% of the height of the cabinet below the upper surface. The bottom portion of the cabinet is defined as an area from the lower surface of the cabinet up to approximately 25% of the height of the cabinet above the lower surface. The middle portion of the cabinet is defined as the rest.

In the present disclosure, the first heat-generating assembly, the second heat-generating assembly, and the third heat-generating assembly comprise one or more heat-generating components.

First Embodiment of the Heat-Dissipating System for High-Power Cabinet

Figure 2:
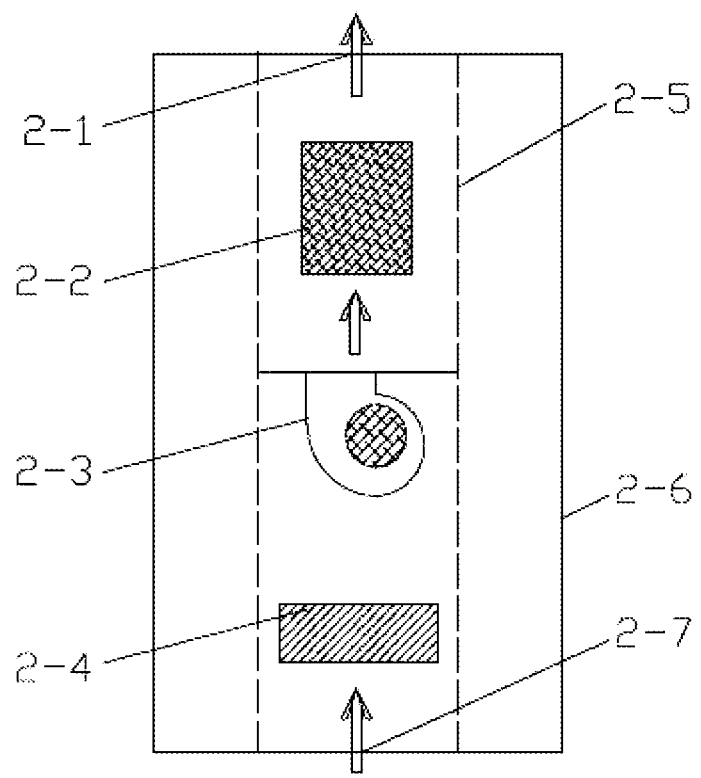
FIG. 2 is a schematic view of the heat-dissipating system for high-power cabinet in the first embodiment of the present disclosure.

Referring to FIG. 2, the heat-dissipating system comprises: a cabinet 2-6, a main air duct 2-5 provided in the cabinet 2-6, and a first heat-generating assembly 2-2, a first fan 2-3 and a second heat-generating assembly 2-4 which are provided in the main air duct 2-5.

The cabinet 2-6 may be in a conventional structure, such as a cuboid cabinet.

A first opening 2-7 and a second opening 2-1 are defined at opposite ends of the main air duct 2-5. The first opening 2-7 is positioned at the bottom of the cabinet 2-6, which is near a ground or other platform for installing the cabinet; the second opening 2-1 is positioned at the top of the cabinet 2-6, which is far away from the ground or other platform for installing the cabinet.

The first fan 2-3 may be an axial fan or a centrifugal fan. For example, the first fan is a centrifugal fan, if the cross-sectional dimension of the main air duct 2-5 is relatively large, the airflow resistance of the heat-dissipating assemblies is relatively big, or higher heat-dissipating efficiency is needed for assemblies generating large amount of heat. The number of the first fan 2-3 may be rational designed depending on heat generating amount of the first heat-generating assembly 2-2 and the second heat-generating assembly 2-4, not limited to one. If the heat generating amount from the first heat-generating assembly 2-2 and the second heat-generating assembly 2-4 is large, a plurality of fans can be used at the same time to cool the first heat-generating assembly 2-2 and the second heat-generating assembly 2-4. In addition, in the case that one first fan 2-3 is enough to cool the first heat-generating assembly 2-2 and the second heat-generating assembly 2-4, a spare first fan can be provided in case the first fan 2-3 in use breaks down. Therefore, the cabinet 2-6 can be normally used all the time in spite of the failure of the first fan 2-3. In the case of a plurality of first fans 2-3, the first fans 2-3 can be freely arranged according to the shape of the cabinet 2-6 and interior structure of the cabinet 2-6, as long as the first fans have a same outlet direction. The first fan 2-3 may also be a variable frequency fan, thus the wind speed of the first fan 2-3 can be adjusted according to actual use conditions, such as the interior temperature of the cabinet, and it is helpful to achieve automatic control, reduce the power consumption of the fan, and prolong the service life of the fan.

In the first embodiment, the second heat-generating assembly 2-4, the first fan 2-3 and the first heat-generating assembly 2-2 are arranged in sequence in the main air duct 2-5 along a direction from the first opening 2-7 to the second opening 2-1 of the main air duct 2-5, i.e., the second heat-generating assembly 2-4 is near the first opening 2-7 of the main air duct 2-5 and the first heat-generating assembly 2-2 is near the second opening 2-1 of the main air duct 2-5. The first fan 2-3 is mounted between the first heat-generating assembly 2-2 and the second heat-generating assembly 2-4 with the outlet of the first fan 2-3 towards the first heat-generating assembly 2-2. At the same time, the outlet of the first fan 2-3 faces away from the first opening 2-7 of the main air duct 2-5, and facing the second opening 2-1. During the operating of the cabinet, the airflow flows through the first opening 2-7, the second heat-generating assembly 2-4, the inlet of the first fan 2-3, the outlet of the first fan 2-3 and the first heat-generating assembly 2-2 in sequence, finally is discharged out of the cabinet 2-6 from the second opening 2-1 of the main air duct 2-5. Therefore, in the heat-dissipating system for high-power cabinet of the first embodiment, the first heat-generating assembly 2-2 is cooled down in manner of blowing air. For example, in the first embodiment the power of the first heat-generating assembly 2-2 is larger than the power of the second heat-generating assembly 2-4, i.e., the heat amount from the first heat-generating assembly 2-2 is larger than the heat amount from the second heat-generating assembly 2-4. Thus, the temperature of the airflow passing only through the second heat-generating assembly 2-4 is not high. That is to say, the temperature of the airflow entering the first fan 2-3 is not high, which is helpful to prolong the service life of the first fan 2-3. In the first embodiment, two heat-generating assemblies are cooled down in a manner of sucking air and blowing air respectively, which may improve the heat-dissipating efficiency for a certain amount of air flow. Therefore, the arrangement of the second heat-generating assembly 2-4, the first fan 2-3 and the first heat-generating assembly 2-2 according to the first embodiment may improve heat-dissipating efficiency, and may prolong the service life of the fan to a certain extent.

The first heat-generating assembly 2-2 may be an IGBT power module constituted of high power IGBTs or other power modules constituted of diodes or thyristors. In the case that the first heat-generating assembly 2-2 comprises a case and a heat sink in the case (see FIG. 14), the outlet of the first fan 2-3 is in sealed connection with the case of the heat sink. Therefore, the airflow blown from the first fan 2-3 can blow directly to the heat sink, which could improve heat-dissipating efficiency. Under the above situation, the case of the heat sink is formed as a part of the main air duct 2-5. For example, an air-guide duct is connected between the case of the heat sink and the second opening 2-1 of the main air duct 2-5, thus heat can be discharged out of the cabinet 2-6 directly. The connection between the air-guide duct and the case of the heat sink and between the air-guide duct and the second opening 2-1 of the main air duct 2-5 are sealed connection, which can prevent hot air from leaking out of the main air duct 2-5.

In the first embodiment, under the conditions allowed, the shape of the main air duct 2-5 is in accordance with the outline shape formed by the arrangement of the first heat-generating assembly 2-2, at least one first fan 2-3 and the second heat-generating assembly 2-4 in order to use the limited space of the cabinet 2-6 reasonably. In the case that only main heat-generating assemblies such as the first heat-generating assembly 2-2, the second heat-generating assembly 2-4 and the first fan 2-3 are provided in the cabinet 2-6, the second opening 2-1 and the first opening 2-7 are defined in the cabinet body, that is, the main air duct 2-5 can be formed by the cabinet body. Alternatively, the main air duct 2-5 may be formed by providing separators in the cabinet 2-6. The manner for forming the main air duct 2-5 is not limited to above examples.

Second Embodiment of the Heat-Dissipating System for High-Power Cabinet

Figure 3:
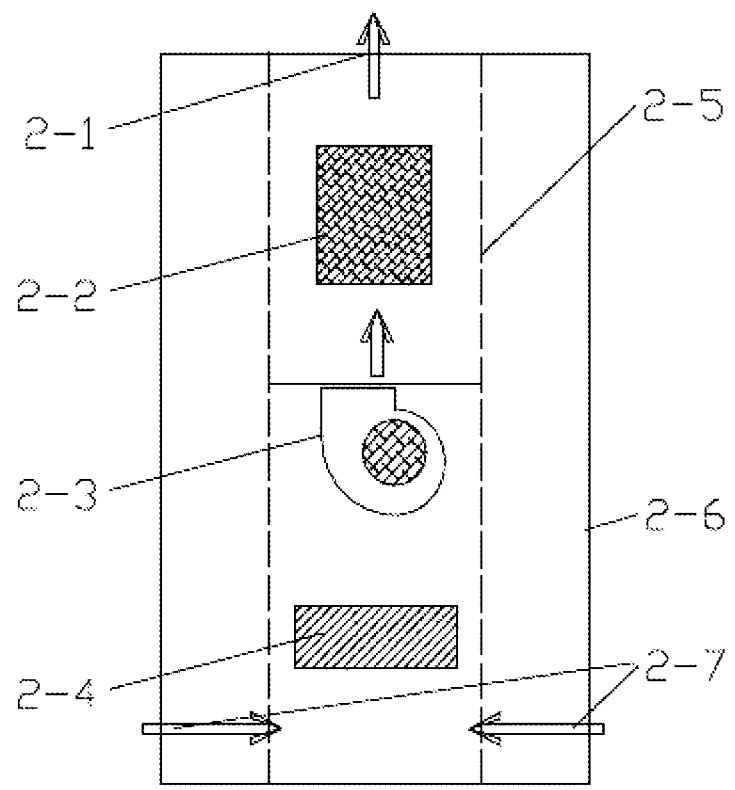
FIG. 3 is a schematic view of the heat-dissipating system for high-power cabinet in the second embodiment of the present disclosure.

Referring to FIG. 3, the difference between the second embodiment and the first embodiment lies in that, the relationship between the outlet wind directions of the first opening 2-7 of the main air duct 2-5 and the first fan 2-3 are different. In the second embodiment, the first opening 2-7 of the main air duct 2-5 locates on side surfaces of the bottom portion of the cabinet 2-6, the outlet wind direction of the first opening 2-7 is perpendicular to the outlet wind direction of the second opening 2-1 of the main air duct 2-5. Other parts of the second embodiment are the same as that of the first embodiment mentioned above and the detailed description is omitted herein.

Third Embodiment of the Heat-Dissipating System for High-Power Cabinet

Figure 4:
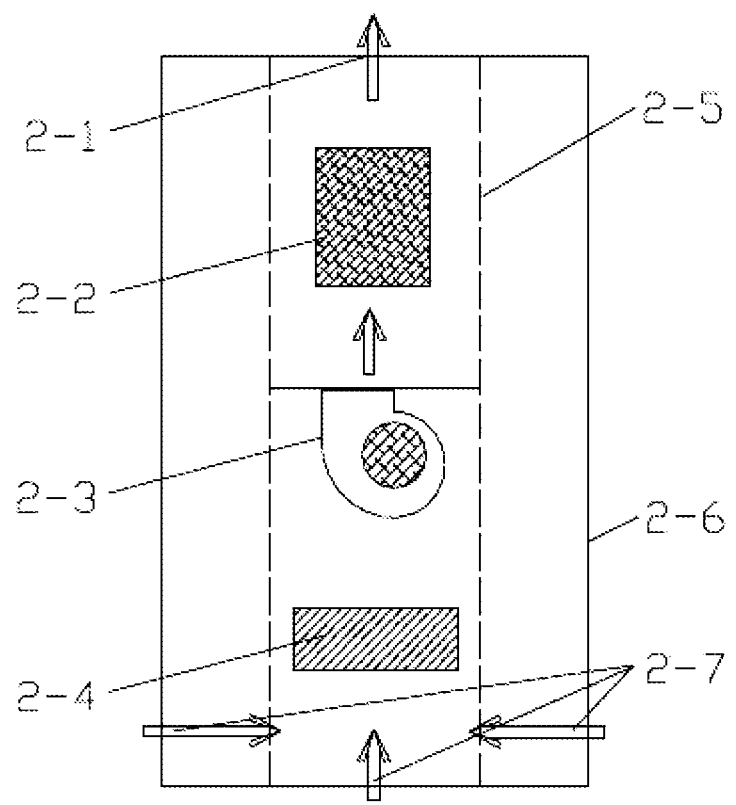
FIG. 4 is a schematic view of the heat-dissipating system for high-power cabinet in the third embodiment of the present disclosure.

Referring to FIG. 4, the difference between the third embodiment and the second embodiment lies in that, the inlet of the main air duct 2-5, i.e., the first openings 2-7 are provided on both side surfaces and bottom surface of the cabinet, such that the air enters into the air duct 2-5 not only in a direction perpendicular to the outlet wind direction of second opening 2-1 of the air duct 2-5, but also in the same direction as the outlet wind direction of second opening 2-1. Furthermore, the air can enter into the first opening 2-7 in direction of 360 degree by adjusting the shape of the side and bottom surfaces of the cabinet to form the first opening of the main air duct, which is not described in detail. Other parts of the third embodiment are the same with that of the first embodiment mentioned above and the detailed description is omitted herein.

Fourth Embodiment of the Heat-Dissipating System for High-Power Cabinet

Figure 5:
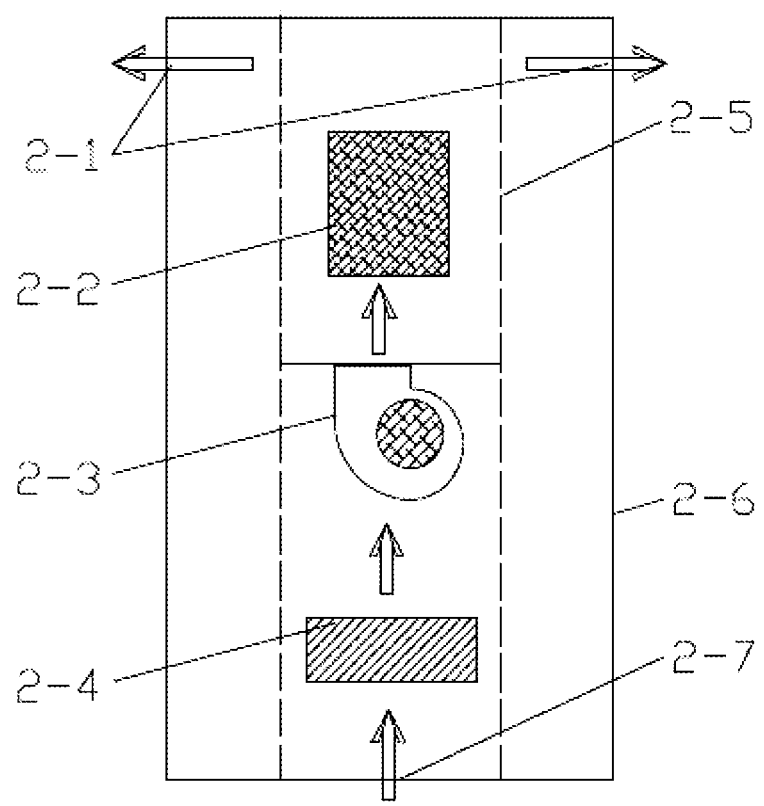
FIG. 5 is a schematic view of the heat-dissipating system for high-power cabinet in the fourth embodiment of the present disclosure.

Referring to FIG. 5, the difference between the fourth embodiment and the first embodiment lies in that, the second opening 2-1 of the main air duct 2-5 is provided on the side surface of the top portion of the cabinet 2-6, such that the outlet wind direction of the main air duct 2-5 is perpendicular to the inlet wind direction of the first opening 2-7 of the main air duct 2-5. Other parts of the fourth embodiment are the same as that of the first embodiment mentioned above and the detailed description is omitted herein.

Fifth Embodiment of the Heat-Dissipating System for High-Power Cabinet

Figure 6:
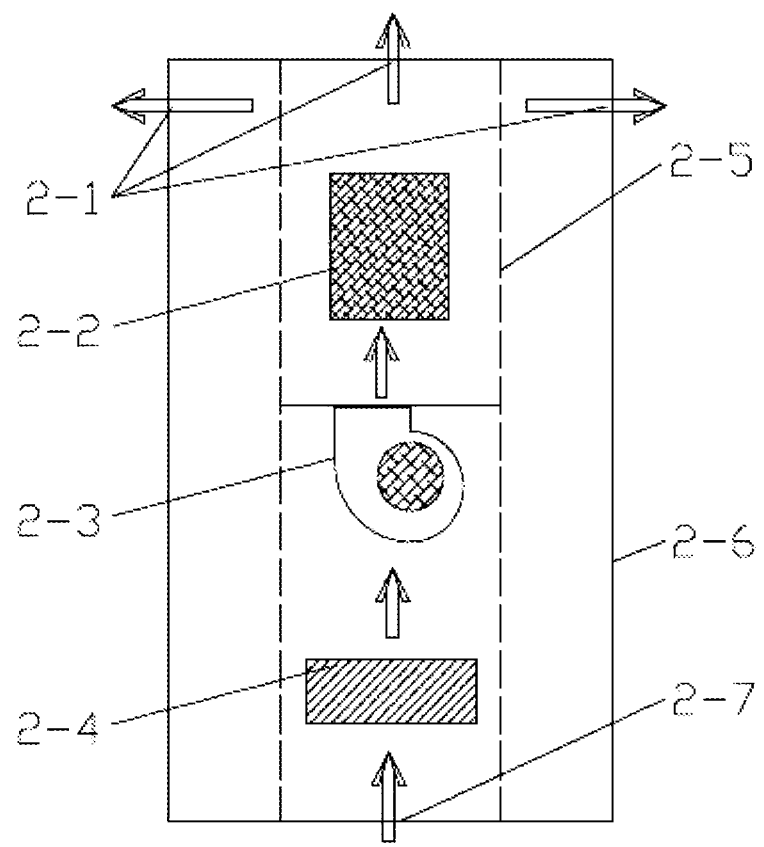
FIG. 6 is a schematic view of the heat-dissipating system for high-power cabinet in the fifth embodiment of the present disclosure.

Referring to FIG. 6, the difference between the fifth embodiment and the fourth embodiment lies in that, the outlet of the main air duct 2-5, such as second opening 2-1, is arranged at the top surface of the cabinet 2-6 and at the side surfaces of the top portion of the cabinet 2-6, such that the air may leave the main air duct 2-5 in a same direction as the inlet wind direction, in a direction perpendicular to the inlet wind direction, and in a direction at other angle to the inlet wind direction. In the operation of the cabinet 2-6, the air flow is discharged out of the main air duct 2-5 from both the top of the cabinet 2-6 and the sides of the top portion of the cabinet 2-6, thus the scope of outlet wind directions is relatively large. Other parts of the fifth embodiment are the same as that of the fourth embodiment mentioned above and the detailed description is omitted herein.

Sixth Embodiment of the Heat-Dissipating System for High-Power Cabinet

Figure 7:
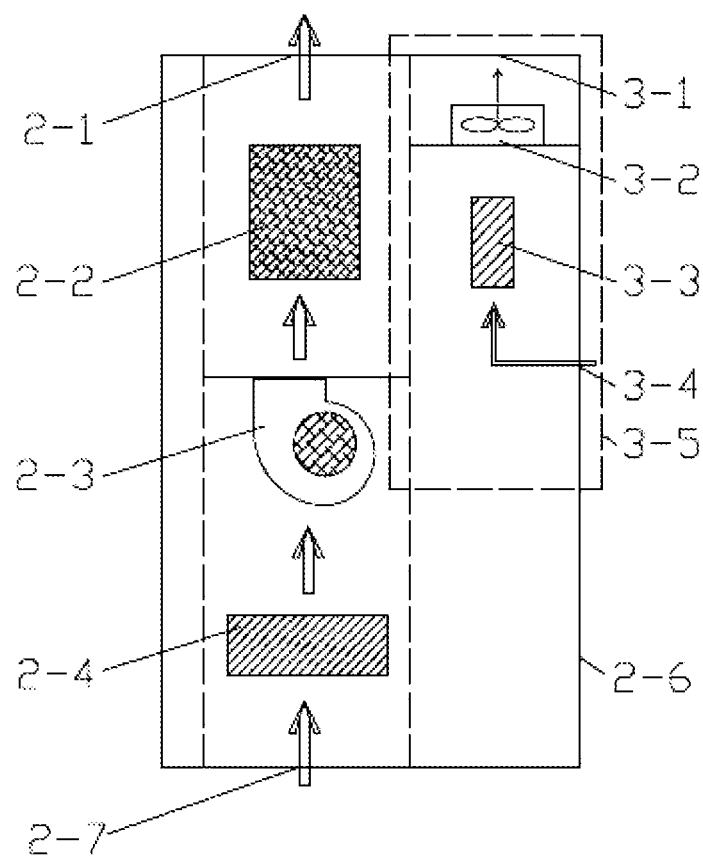
FIG. 7 is a schematic view of the heat-dissipating system for high-power cabinet in the sixth embodiment of the present disclosure.

Referring to FIG. 7, a schematic view of the heat-dissipating system for high-power cabinet in the sixth embodiment of the present disclosure is shown. In the sixth embodiment, heat-generating assembly comprises not only the first heat-generating assembly 2-2 and the second heat-generating assembly 2-4 used as main heat-emitting assemblies, but also a third auxiliary heat-generating assembly 3-3. Accordingly, a second fan 3-2 is provided in the cabinet to dissipate heat from the third heat-generating assembly 3-3 besides the first fan 2-3 used for dissipating heat from the first heat-generating assembly 2-2 and the second heat-generating assembly 2-4. That is, on the basis of the first embodiment mentioned above, the third heat-generating assembly 3-3 and the second fan 3-2 are added in the sixth embodiment. The structure and arrangement of the first heat-generating assembly 2-2, the second heat-generating assembly 2-4 and the first fan 2-3 may be the same as in the first embodiment or as in other embodiments, the detailed description is omitted herein. The third heat-generating assembly 3-3, the second fan 3-2 and related structures thereof and arrangement are introduced as follows.

The second fan 3-2 may be a centrifugal fan or an axial fan. Taking into account the third heat-generating assembly 3-3 as an auxiliary device which generates relatively small heat amount, therefore, the second fan 3-2 is an axial fan in order to reduce costs. In the sixth embodiment, an exemplary arrangement of the first fan 2-3 and the second fan 3-2 is that, the first heat-generating assembly 2-2 and the second heat-generating assembly 2-4 are used as main heat generating assemblies, and the first fan 2-3 for cooling is centrifugal fan; while the third heat-generating assembly 3-3 is used as an assistant heat generating assembly, and the second fan 3-2 for cooling is axial fan. Therefore, the heat-dissipating effect can be ensured, and the cost can be reduced. In order to regulate the speed of the second fan 3-2 or fit into an automatic control system, the second fan 3-2 may be selected as variable frequency fan.

Preferably, in order to separate the airflow supplied to dissipate heat for the first heat-generating assembly 2-2 and the second heat-generating assembly 2-4 from the airflow supplied to dissipate heat for the third heat-generating assembly 3-3, and thus avoid the interaction of two airflow with different temperature to degrade the cooling effect, in the sixth embodiment, an assistant air duct 3-5 is provided in the cabinet 2-6. The third heat-generating assembly 3-3 and the second fan 3-2 are provided in the assistant air duct 3-5. The assistant air duct 3-5 has a third opening 3-4 used for sucking airflow and a fourth opening 3-1 used for discharging the airflow. The fourth opening 3-1 of the assistant air duct 3-5 may be provided on the top of the cabinet 2-6, far away from ground or other platform for placing the cabinet. The third opening 3-4 of the assistant air duct 3-5 may be provided in the side surface of the cabinet 2-6. In the case that no assistant air duct 3-5 is provided, the airflow used to dissipate heat for the third heat-generating assembly 3-3 may be sucked into the cabinet 2-6 through the first opening 2-7 of the main air duct 2-5, and discharged out of the cabinet 2-6 through the second opening 2-1 of the main air duct 2-5 by the second fan 3-2.

The mutual relationships among the main air duct 2-5, the assistant air duct 3-5 and the cabinet 2-6 are divided as follows: first, the main air duct 2-5 and the assistant air duct 3-5 are provided in independent air ducts of the cabinet 2-6 respectively; second, the cabinet 2-6 is divided into two separate space by a partition plate, in which one space defines the main air duct 2-5, the other space define the assistant air duct 3-5, in that case, the first opening 2-7 and the second opening 2-1 of the main air duct 2-5, and the third opening 3-4 and the fourth opening 3-1 of the assistant air duct 3-5 are defined in corresponding portions of the cabinet 2-6 respectively; third, the main air duct 2-5 is an independent air duct provided in the cabinet 2-6, and the assistant air duct 3-5 is defined in a space between the cabinet 2-6 and the main air duct 2-5, in that case, the third opening 3-4 and the fourth opening 3-1 of the assistant air duct 3-5 are defined on the cabinet 2-6, respectively; fourth, assistant air duct 3-5 is an independent air duct provided in the cabinet 2-6, and the main air duct 2-5 is defined in a space between the cabinet 2-6 and the assistant air duct 3-5, in that case, the first opening 2-7 and the second opening 2-1 of the main air duct 2-5 are defined on the cabinet 2-6 respectively. Furthermore, the main air duct and the assistant air duct may be formed in other arrangements of which the detailed descriptions are omitted.

In these exemplified embodiments, the outlet wind direction of the fourth opening 3-1 of the assistant air duct may or may not be the same as the outlet wind direction of the second opening 2-1 of the main air duct. If they are the same, it is helpful to improve the regional concentration of hot air discharge. In the case that both the fourth opening 3-1 and the second opening 2-1 are provided on the top of the cabinet 2-6, it benefits to some extent to discharge the hot air. The outlet of the second fan 3-2 faces away from the third heat-generating assembly 3-3. The air flow enters the assistant air duct from the third opening 3-4 of the assistant air duct 3-5, flows through the third heat-generating assembly 3-3, the inlet of the second fan 3-2 and the outlet of the second fan 3-2 in sequence, finally is discharged out of the assistant air duct 3-5 from the fourth opening 3-1 of the assistant air duct 3-5. In the sixth embodiment, the second fan 3-2 dissipates heat from the third heat-generating assembly 3-3 in a manner of sucking. As the third heat-generating assembly 3-3 is not a main heat-generation assembly, which generates relatively small heat amount, the temperature of air entered into the second fan is low, therefore, the service life of the second fan 3-2 may not be affected even if the third heat-generating assembly 3-3 is cooled down in manner of sucking.

Additionally, in order to reasonably use the limited space of the cabinet 2-6 or to improve heat-dissipating efficiency, the shape of the assistant air duct 3-5 is in accordance with the outline shape formed by the arrangement of the third heat-generating assembly 3-3 and the second fan 3-2. In the case that there are a plurality of third heat-generating assemblies 3-3 which are dispersed in the cabinet 2-6, a plurality of assistant air ducts 3-5 are provided in the cabinet 2-6 in order to install the third heat-generating assemblies 3-3 respectively. One or more second fans 3-2 for cooling the third heat-generating assembly 3-3 are provided in each assistant air duct 3-5.

Seventh Embodiment of the Heat-Dissipating System for High-Power Cabinet

Figure 8:
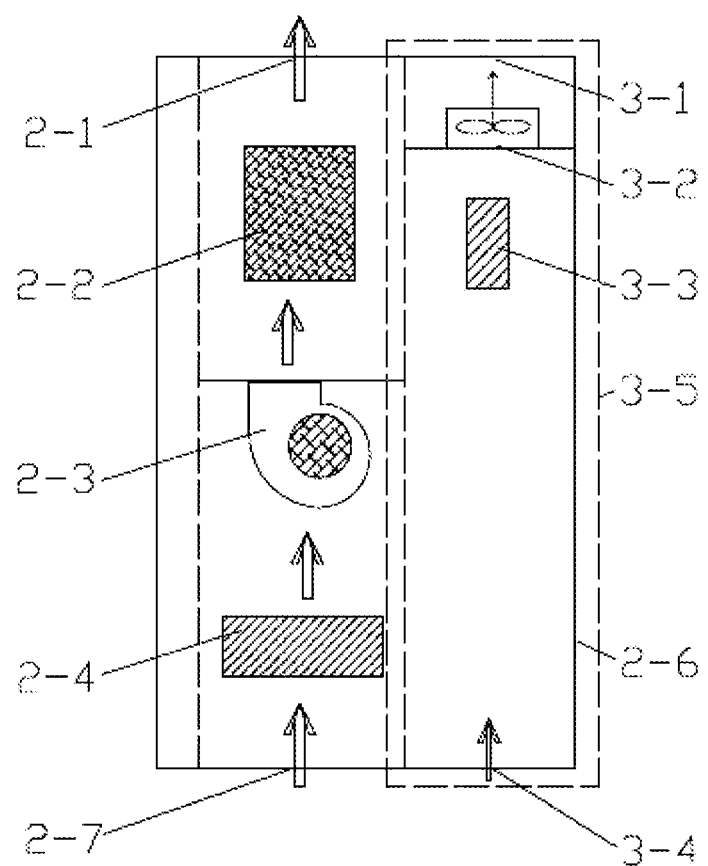
FIG. 8 is a schematic view of the heat-dissipating system for high-power cabinet in the seventh embodiment of the present disclosure.

Referring to FIG. 8, the difference between the seventh embodiment and the sixth embodiment lies in that, the third opening 3-4 of the assistant air duct 3-5 is located on the bottom surface of the cabinet 2-6, near ground for placing the cabinet. Other parts of the seventh embodiment are the same as that of the sixth embodiment mentioned above and the detailed description is omitted herein.

Eighth Embodiment of the Heat-Dissipating System for High-Power Cabinet

Figure 9:
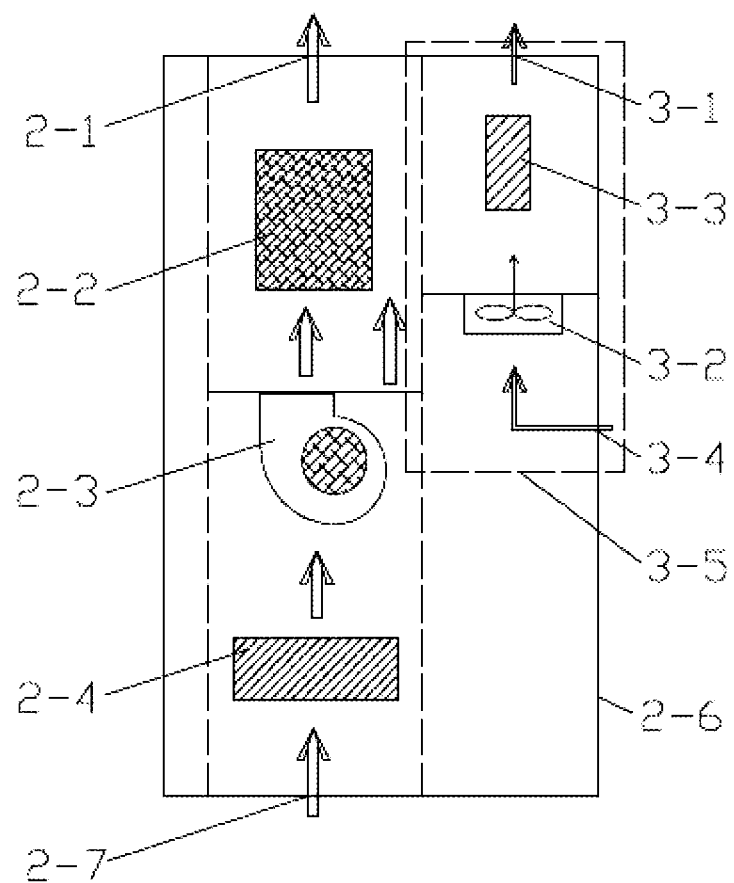
FIG. 9 is a schematic view of the heat-dissipating system for high-power cabinet in the eighth embodiment of the present disclosure.

Referring to FIG. 9, the difference between the eighth embodiment and the sixth embodiment lies in that, the outlet of the second fan 3-2 is towards the third heat-generating assembly 3-3. The airflow enters the assistant air duct 3-5 from the third opening 3-4 of the assistant air duct 3-5, flows through the inlet of the second fan 3-2, the outlet of the second fan 3-2 and the third heat-generating assembly 3-3, finally is discharged out of the assistant air duct 3-5 through the fourth opening 3-1 of the assistant air duct 3-5. In the eighth embodiment, the second fan 3-2 cools the third heat-generating assembly 3-3 in a manner of blowing airflow. The temperature of the airflow entering the second fan 3-2 is relatively low, which is beneficial to prolonging the service life of the second fan 3-2. Other parts of the eighth embodiment are the same as that of the sixth embodiment mentioned above and the detailed description is omitted herein.

Ninth Embodiment of the Heat-Dissipating System for High-Power Cabinet

Figure 10:
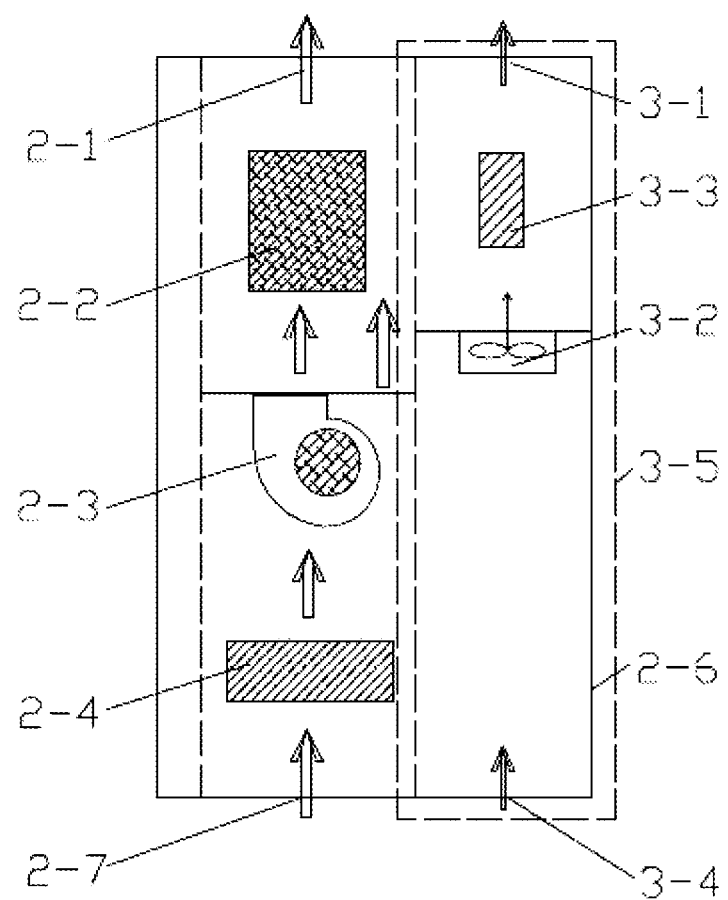
FIG. 10 is a schematic view of the heat-dissipating system for high-power cabinet in the ninth embodiment of the present disclosure.

Referring to FIG. 10, the difference between the ninth embodiment and the eighth embodiment lies in that, the third opening 3-4 of the assistant air duct 3-5 is provided on the bottom surface of the cabinet 2-6, which is near the ground for placing the cabinet. Other parts of the ninth embodiment are the same as that of the eighth embodiment mentioned above and the detailed description is omitted herein.

Tenth Embodiment of the Heat-Dissipating System for High-Power Cabinet

Figure 11:
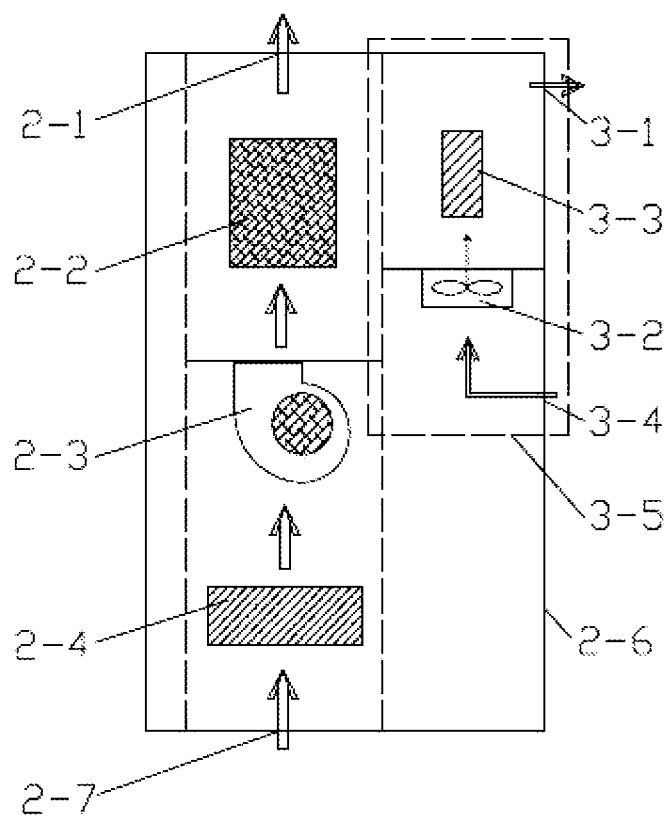
FIG. 11 is a schematic view of the heat-dissipating system for high-power cabinet in the tenth embodiment of the present disclosure.

Referring to FIG. 11, the difference between the tenth embodiment and the eighth embodiment lies in that, the fourth opening 3-1 of the assistant air duct 3-5 is provided on the side of the cabinet 2-6, which is far away from the ground for placing the cabinet. Other parts of the tenth embodiment are the same as that of the eighth embodiment mentioned above and the detailed description is omitted herein.

Eleventh Embodiment of the Heat-Dissipating System for High-Power Cabinet

Figure 12:
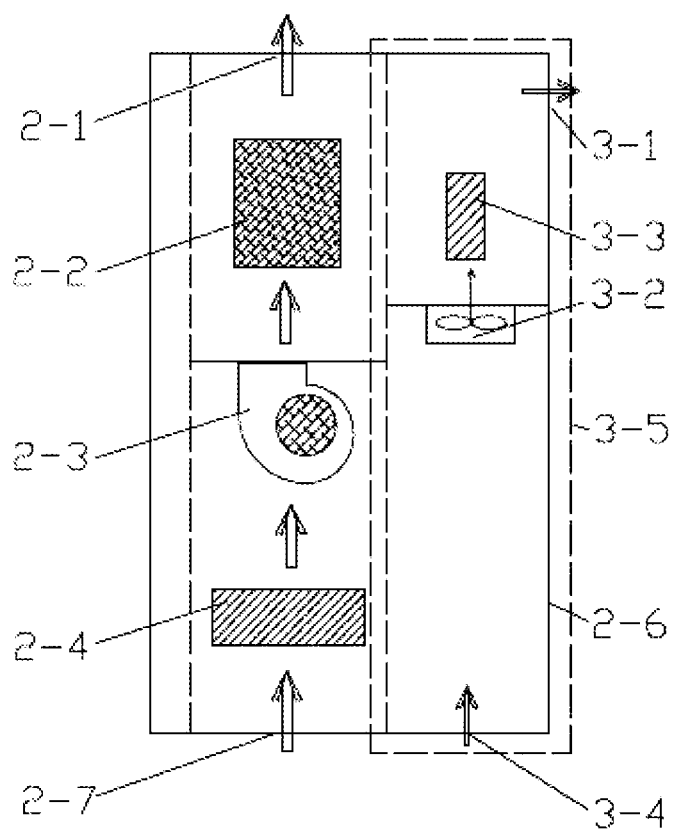
FIG. 12 is a schematic view of the heat-dissipating system for high-power cabinet in the eleventh embodiment of the present disclosure.

Referring to FIG. 12, the difference between the eleventh embodiment and the tenth embodiment lies in that, the third opening 3-4 of the assistant air duct 3-5 is provide on the bottom of the cabinet 2-6, which is near the ground for placing the cabinet. Other parts of the eleventh embodiment are the same as that of the tenth embodiment mentioned above and the detailed description is omitted herein.

Twelfth Embodiment of the Heat-Dissipating System for High-Power Cabinet

Figure 13:
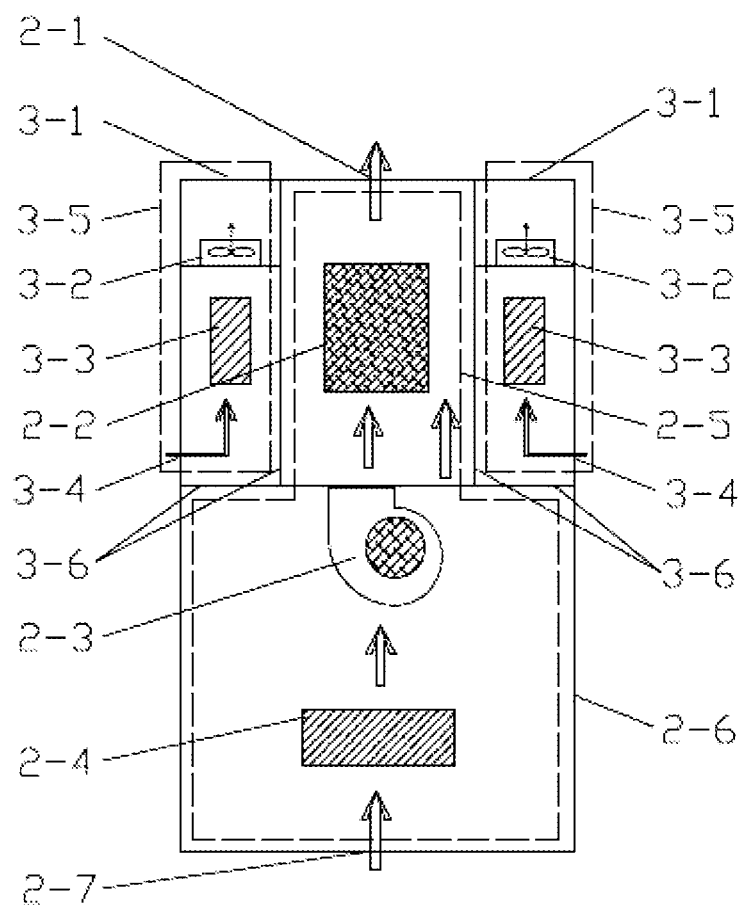
FIG. 13 is a schematic view of the heat-dissipating system for high-power cabinet in the twelfth embodiment of the present disclosure.

Referring to FIG. 13, the difference between the twelfth embodiment and the eighth embodiment lies in that, two third heat-generating assemblies 3-3 are provided in upper two sides of the cabinet 2-6 respectively, i.e., in the twelfth embodiment, two second fans 3-2 are provided to cool the two third heat-generating assemblies 3-3 respectively. Furthermore, two independent assistant air ducts 3-5 are provided in the cabinet 2-6, and a third heat-generating assembly 3-3 and a second fan 3-2 are installed in each assistant air duct 3-5. Both of the two independent assistant air ducts 3-5 may share the space between the cabinet 2-6 and the main air duct 2-5 to constitute a common assistant air duct. Other parts of the twelfth embodiment are the same as that of the eighth embodiment mentioned above and the detailed description is omitted herein.

Among the sixth embodiment to the twelfth embodiment, structures comprising assistant air duct 3-5 and assistant heat-dissipating assemblies extended from the first embodiment of the present disclosure are described. The structure of the assistant air duct 3-5 and assistant heat-dissipating assemblies can be combined with any one among the second embodiment to the fifth embodiment to form a new embodiment, instead of being combined with the first embodiment. That is, embodiments of the present disclosure mentioned above, especially the main air duct 2-5, the interior structures of the main air duct 2-5, the assistant air duct 3-5 and the interior structures thereof, can be combined with each other freely.

The static var compensation system of the present disclosure comprises at least one heat-dissipating system for high-power cabinet of the present disclosure, which shows the application of the heat-dissipating system for high-power cabinet of the present disclosure in static var compensation system.

Embodiment of the Static Var Compensation System

Figure 14:
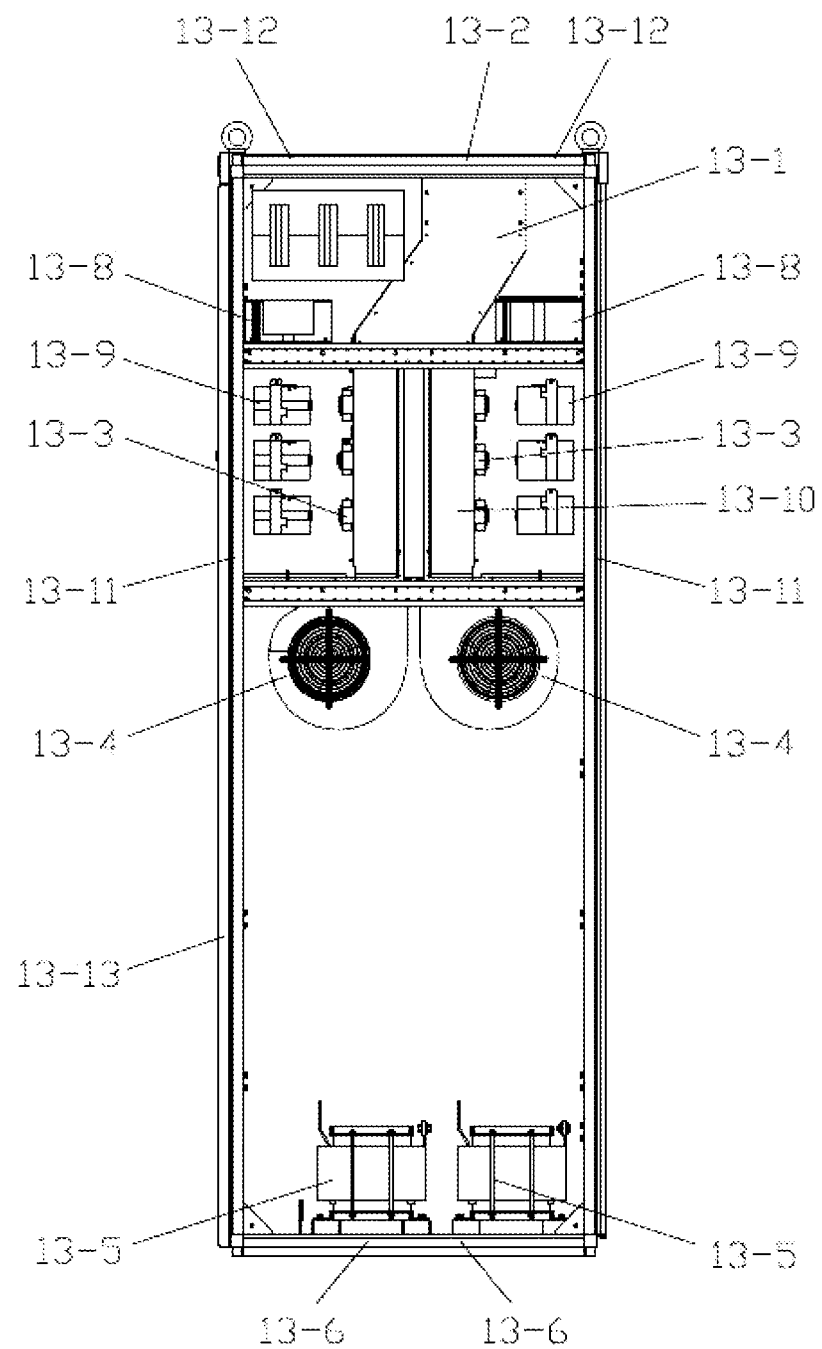
FIG. 14 is a schematic view of a static var compensation system according to an embodiment of the present disclosure.

FIG. 14 shows the twelfth embodiment of the heat-dissipating system for high-power cabinet of the present disclosure shown in FIG. 13 is applied to a static var compensation (SVC) system. Static var compensation system comprises a cabinet 13-13, a main air duct and an assistant air duct formed in the cabinet 13-13, an IGBT power module as the first heat-generating assembly, an reactor 13-5 as the second heat-generating assembly, a capacitor bank as the third heat-generating assembly, a centrifugal fan 13-4 as the first fan, and an axial fan 13-8 as the second fan.

The cabinet 13-13 is in a shape of cuboid, which has a top plate, a bottom plate, two side plates, a front plate and a back plate. The top plate is far away from ground for placing the cabinet 13-13, and the bottom plate is near ground or platform for placing the cabinet 13-13. Inlets 13-6 of the main air duct are defined in the bottom plate of the cabinet 13-13. The inlets 13-6 may be grid-like openings in an array. An outlet 13-2 of the main air duct is defined in the top plate of the cabinet 13-13. Two inlets 13-11 of assistant air ducts are defined in two side plates of the cabinet 13-13 respectively. Two outlets 13-12 of the assistant air duct are defined in the top plate of the cabinet 13-13, and on two sides of the outlet of main air duct 13-2 respectively.

The reactor 13-5 is mounted in the bottom plate of the cabinet 13-13. The IGBT power modules are mounted in the middle or upper portion of the cabinet 13-13. The capacitor bank comprises a plurality of capacitors 13-9, which are divided into two groups symmetrically distributed at left and right sides of the IGBT power modules. An axial fan 13-8 is provided above each group of capacitor 13-9. The arrangement of the capacitors 13-9 is not limited thereto. For example, the capacitors 13-9 may be arranged into a ring or other forms.

There are 18 IGBTs for example. Each group of the IGBT power module comprises 3 IGBTs 13-3 and is mounted on a heat sink. Each heat sink is covered with a case 13-10. A centrifugal fan 13-4 is mounted under each heat sink. The centrifugal fan 13-4 and case 13-10 are in sealed connection. Therefore, in the dissipation system of the SVG cabinet, there are six heat sinks and six centrifugal fans 13-4 corresponding to six cases 13-10 of six heat sinks respectively, thus six outlet ducts are formed. Exemplary arrangement of 6 heat sinks is as follows: six heat sinks are divided into left and right lines, with three heat sinks in each line; accordingly, six centrifugal fans 13-4 are arranged into left and right lines, with three centrifugal fans 13-4 in each line, moreover, the two lines of centrifugal fans 13-4 are arranged in mirror symmetry with each other. Therefore, six outlets of six centrifugal fans 13-4 are concentrated at a central location, which is beneficial to decreasing the size of whole cabinet 13-13. But the arrangement is not limited thereto. According to the shape of the cabinet, other arrangement of various assemblies in the cabinet may be conceived and obtained. Actually, six heat sinks may be covered with one common case, with six outlets of six centrifugal fans 13-4 being all towards the common case so as to form a independent air duct. A common air-guide duct 13-1 is provided on the top of six cases 13-10 of six heat sinks, which guides airflow out of the cabinet 13-13 through the outlet of main air duct 13-2. The bottom of the air-guide duct 13-1 is in sealed connection with the case of the heat sink, and the top of the air-guide duct 13-1 is in sealed connection with the outlet 13-2 of the main air duct. Therefore, the main air duct mentioned above is defined by the inlet 13-6 at the bottom plate of the cabinet 13-13, the lower and middle part of the cabinet 13-13, the cases of the heat sink, the air-guide duct 13-1 and the outlet 13-2 at the top plate of the cabinet 13-13. The assistant air duct mentioned above is defined by the two inlets 13-11 at two side plates of the cabinet 13-13, the space between the cases 13-10 of the heat sink and the cabinet 13-13, the space between the air-guide duct 13-1 and cabinet 13-13 and the outlets 13-12 at the top plate of the cabinet 13-13. External cool airflow enters into the cabinet 13-13 from the inlets 13-11 at the side plates, flows through the capacitors 13-9 and the axial fan 13-8 in sequence, finally is discharged out of the cabinet from the outlets 13-12 at the top plate of the cabinet 13-13, so as to cool down the capacitors 13-9. As to the assistant air duct, a partition may be provided in the cabinet 13-13 to form two independent assistant air ducts. A plurality of capacitors 13-9 and an axial fan 13-8 may be mounted in each assistant air duct. In the case that there are more capacitors 3-9, more axial fans 13-8 may be mounted in the assistant air duct. Heat amount generated from the capacitor 3-9 is relatively small, thus an axial fan 13-8 of smaller size and lower cost is, for example, used to cooling down the capacitors 13-9, which is beneficial to compacting the interior structure of the cabinet. In the assistant air duct, the position of the capacitors 13-9 and the axial fan 13-8 may be reversed with each other, i.e., the axial fan 13-8 is mounted under the capacitor 3-9, then the axial fan 13-8 cools down the capacitors 13-9 in manner of blowing airflow.

In the static var compensation system, the reactor 13-5 in the main air duct, centrifugal fan 13-4 and IGBT power module are sequentially arranged from bottom to top. During operation of the static var compensation system, external cool airflow enters into the cabinet 13-13 from the inlets 13-6 of the bottom plate of the cabinet 13-13, flows through the reactors 13-5 to cool down the reactor, and is sucked through the inlet of the centrifugal fan 13-4, then blows the heat sink of the IGBT power module to cool down the IGBT power module, the temperature of the airflow rises due to absorbing heat, the airflow with higher temperature flows out of the heat sink and aggregates at the air-guide duct 13-1, finally is discharged out of the cabinet 13-13 from the outlet 13-2 at the top plate of the cabinet 13-13.

The centrifugal fan 13-4 is provided between the reactor 13-5 and the IGBT power module, and mounted in the middle of the cabinet 13-13. The heat sink of the IGBT power module is cooled down by the centrifugal fan 13-4 in manner of blowing airflow, which fully guarantees there is enough airflow to cool. Air amount generated by 6 centrifugal fans is large, and the heat amount generated by the reactor 13-5 is smaller than that of the IGBT power module, therefore, the temperature of the airflow flowing through the reactor 13-5 and then entering into centrifugal fan 13-4 is relatively low, thus the service life of the centrifugal fan 13-4 is not affected, and the noise is relatively small. Besides, the airflow flows through the reactor 13-5 from bottom to top, which is beneficial to heat dissipation from the reactor 13-5. The airflow flowing through the heat sink of the IGBT power module becomes hot, and is directly discharged out of the cabinet 13-13 via the air-guide duct 13-1 without heating other assemblies on the top, the service life of other assemblies is not affected. Moreover, such arrangement of the assemblies in the main air duct is helpful to avoid high temperature airflow entering into the centrifugal fan 13-4, thus is beneficial to prolonging the service life of the centrifugal fan 13-4. Furthermore, the centrifugal fan 13-4 may choose to use variable frequency fan, the speed of which may be separately adjusted according to the temperature in the main air duct, and a redundant design may be adopted if needed.

The heat-dissipating system for high-power cabinet mentioned above is only an exemplary embodiment applied to static var compensation system. In practical applications, the heat-dissipating system for high-power cabinet may be applied to other systems such as uninterruptible power systems (UPS) or other power systems.

One or more of the advantages and positive effects of the heat-dissipating system for high-power cabinet and the static var compensation system are as follows.

The first fan is not provided in the top of the cabinet, but provided between the first heat-generating assembly and the second heat-generating assembly, therefore noise acoustic waves from the first fan during operation can be obstructed by the first heat-generating assembly, the second heat-generating assembly and the cabinet, which can reduce the noise spreading outside the cabinet.

The outlet of the first fan is facing the first heat-generating assembly, the airflow flows through the second heat-generating assembly, the first fan, the first heat-generating assembly, and the second opening in sequence, and finally is discharged out of the cabinet with the heat so as to cool the first heat-generating assembly and the second heat-generating assembly.

The first fan is installed between the second heat-generating assembly and the first heat-generating assembly, and the first fan cools the second heat-generating assembly in a manner of sucking air and cools the first heat-generating assembly in manner of blowing air. Thereby, the heat-dissipating system for high-power cabinet adopts a combination of various heat-dissipating manner, and the position of the first fan relative to the first heat-generating assembly and the second heat-generating assembly is reasonable arranged, which is thus beneficial to prolonging the service life of the first fan or decreasing the noise spreading outside from the first fan.

It should be noted that the above embodiments are only illustrated for describing the technical solution of the disclosure and not restrictive, and although the embodiments are described in detail by referring to the aforesaid embodiments, the skilled in the art should understand that the aforesaid embodiments can be modified and portions of the technical features therein may be equally changed, which does not depart from the spirit and scope of the technical solution of the embodiments of the disclosure.

What is claimed is:

1. A heat-dissipating system for high-power cabinet, comprising: a cabinet, which has a cuboidal shape; at least one main air duct with a first opening and a second opening, which is formed in the cabinet, the at least one main of duct comprising independent air ducts, and a first heat-generating assembly; a second heat-generating assembly and at least one first fan, which are mounted in of the at least one main air duct, the first fan is located between the first heat-generating assembly and the second heat-generating assembly; and an outlet of the first fan faces towards the first heat-generating assembly, airflow in the main air duct flows from the first opening to the second heat-generating assembly, an inlet of the first fan, the outlet of the first fan, and the first heat-generating assembly in sequence, and finally is discharged out of the cabinet from the second opening of the main air duct of the cabinet; wherein the first heat-generating assembly is an IGBT power module, the second heat-generating assembly is a reactor, and the first heat-generating assembly and the second heat-generating assembly are both electronic assemblies used in the Static Var Compensation system, wherein a heat amount from the first heat-generating assembly is larger than a heat amount from by the second heat-generating assembly; the first heat-generating assembly and the second heat-generating assembly are both electronic assemblies used in the power system.

2. The heat-dissipating system of claim 1, wherein the first heat-generating assembly comprises a case and a heat sink inside the case, and the outlet of the first fan is in sealed connection with the case.

3. The heat-dissipating system of claim 2, wherein the heat-dissipating system further comprises an air-guide duct mounted between the case of the heat sink and the second opening of the main air duct, and the air-guide duct is in sealed connection with the case of the heat sink, the airflow flowing through the heat sink is guided by the air-guide duct to be discharged from the second opening.

4. The heat-dissipating system of claim 1, wherein the second opening of the main air duct is defined at least one of the top surface of the cabinet and the side surface of the cabinet far away from the ground for placing the cabinet.

5. The heat-dissipating system of claim 1, wherein the first opening of the main air duct is defined at least one of the bottom surface of the cabinet and on the side surface of the cabinet near the ground for placing the cabinet.

6. The heat-dissipating system of claim 1, wherein the first fan is a variable frequency fan.

7. The heat-dissipating system of claim 1, wherein the heat-dissipating system comprises a plurality of first fans.

8. The heat-dissipating system of claim 7, wherein the plurality of first fans are arranged in mirror symmetry.

9. The heat-dissipating system of claim 1, wherein the heat-dissipating system further comprises at least one assistant air duct, which is provided in the cabinet and separated from the main air duct, the assistant air duct has a third opening and a fourth opening, and at least one third heat-generating assembly and at least one second fan for cooling the third heat-generating assembly are provided in the assistant air duct, the airflow enters into the assistant air duct from the third opening, and flows through the second fan, the third heat-generating assembly, and finally is discharged out of the fourth opening.

10. The heat-dissipating system of claim 9, wherein the outlet wind direction of the fourth opening is the same as the outlet wind direction of the second opening.

11. The heat-dissipating system of claim 9, wherein the fourth opening of the assistant air duct is defined at least one of the top surface of the cabinet and the side surface of the cabinet far away from the ground for placing the cabinet.

12. The heat-dissipating system of claim 9, wherein the third opening of the assistant air duct is defined at least one of the side surface of the cabinet and the bottom surface of the cabinet near the ground for placing the cabinet.

13. The heat-dissipating system of claim 9, wherein the first fan is a centrifugal fan, and the second fan is an axial fan.

14. The heat-dissipating system of claim 9, wherein the second fan is a variable frequency fan.

15. The heat-dissipating system of claim 9, wherein the third heat-generating assembly is a capacitor bank.

\* \* \* \* \*